United States Patent
Coon et al.

(10) Patent No.: US 10,527,956 B2
(45) Date of Patent: Jan. 7, 2020

(54) TEMPERATURE CONTROLLED HEAT TRANSFER FRAME FOR PELLICLE

(71) Applicant: NIKON CORPORATION, Tokyo (JP)

(72) Inventors: Paul Derek Coon, Redwood City, CA (US); Soichi Owa, Tokyo (JP)

(73) Assignee: NIKON CORPORATION (JP)

( * ) Notice: Subject to any disclaimer, the term of this patent is extended or adjusted under 35 U.S.C. 154(b) by 0 days.

(21) Appl. No.: 15/923,283

(22) Filed: Mar. 16, 2018

(65) Prior Publication Data
US 2018/0275534 A1    Sep. 27, 2018

Related U.S. Application Data

(60) Provisional application No. 62/476,476, filed on Mar. 24, 2017.

(51) Int. Cl.
| | |
|---|---|
| G03B 27/52 | (2006.01) |
| G03F 7/20 | (2006.01) |
| G03F 1/64 | (2012.01) |

(52) U.S. Cl.
CPC ............ *G03F 7/70875* (2013.01); *G03F 1/64* (2013.01); *G03F 7/70008* (2013.01); *G03F 7/70983* (2013.01)

(58) Field of Classification Search
CPC ..... G03F 1/62; G03F 1/64; G03F 1/66; G03F 1/22; G03F 7/70008; G03F 7/70025; G03F 7/70033; G03F 7/70325; G03F 7/70785; G03F 7/708; G03F 7/70841; G03F 7/70858; G03F 7/70866; G03F 7/70883; G03F 7/70891; G03F 7/70908; G03F 7/70983;
(Continued)

(56) References Cited

U.S. PATENT DOCUMENTS

| | | |
|---|---|---|
| 5,579,147 A | 11/1996 | Mori et al. |
| 5,614,988 A | 3/1997 | Kato et al. |
| 5,739,899 A | 4/1998 | Nishi et al. |

(Continued)

FOREIGN PATENT DOCUMENTS

WO    WO2009083229 A1    7/2009

OTHER PUBLICATIONS

Hawryluk, Andrew M. et al; "Soft x-ray projection lithography using an x-ray reduction camera", J. Vac. Sci. Technol. B, Nov./Dec. 1988, vol. 6, No. 6, Lawrence Livermore National Laboratory, University of California, Livermore, California.
(Continued)

*Primary Examiner* — Christina A Riddle
(74) *Attorney, Agent, or Firm* — Roeder & Broder LLP; Steven G. Roeder

(57) ABSTRACT

An exposure apparatus for transferring a pattern from a reticle to a workpiece, a pellicle being positioned near the reticle, includes a heat transfer frame, an illuminator, and a temperature controller. The heat transfer frame is configured to be positioned near the pellicle, the heat transfer frame defining a beam aperture. The illuminator directs a beam through the beam aperture and the pellicle at the reticle. The temperature controller controls the temperature of the heat transfer frame to control the temperature of the pellicle. The illuminator can direct the beam from a beam source, such as an EUV beam source. Additionally, the temperature controller can cryogenically cool the heat transfer frame.

35 Claims, 5 Drawing Sheets

(58) Field of Classification Search
CPC ............. G03F 7/70875; G03F 7/70958; G03F 7/70916; H01L 21/0274
USPC ......... 355/30, 52, 53, 55, 67–77; 250/492.1, 250/492.2, 492.22, 493.1, 548; 430/5
See application file for complete search history.

(56) References Cited

U.S. PATENT DOCUMENTS

| | | | | |
|---|---|---|---|---|
| 6,153,877 | A * | 11/2000 | Ashida | G03F 7/70866 250/216 |
| 6,225,027 | B1 | 5/2001 | Replogle et al. | |
| 6,492,067 | B1 * | 12/2002 | Klebanoff | G03F 1/64 428/14 |
| 6,512,573 | B2 | 1/2003 | Furter | |
| 7,068,350 | B2 | 6/2006 | Nishi et al. | |
| 7,671,970 | B2 | 3/2010 | Loopstra | |
| 8,133,661 | B2 | 3/2012 | Chang et al. | |
| 8,623,588 | B2 | 1/2014 | Sewell | |
| 2001/0026355 | A1 * | 10/2001 | Aoki | G03F 1/64 355/30 |
| 2005/0275821 | A1 * | 12/2005 | Miyajima | G03B 27/72 355/69 |
| 2006/0146313 | A1 * | 7/2006 | Gallagher | G03F 1/60 355/75 |
| 2013/0021594 | A1 * | 1/2013 | Umemura | G03F 7/707 355/75 |
| 2014/0023973 | A1 | 1/2014 | Marconi et al. | |
| 2014/0253892 | A1 | 9/2014 | Yu et al. | |
| 2015/0131071 | A1 * | 5/2015 | Kim | G03F 7/707 355/72 |
| 2016/0033860 | A1 * | 2/2016 | Wiley | G03F 1/62 355/67 |
| 2017/0176850 | A1 * | 6/2017 | Chen | G03F 1/22 |
| 2017/0336720 | A1 | 11/2017 | Binnard et al. | |
| 2018/0364561 | A1 * | 12/2018 | Vles | G03F 7/7085 |

OTHER PUBLICATIONS

Wynne, C.G.; "Two-Mirror Anastigmats; Journal of the Optical Society of America", May 1969, vol. 59, No. 5, Optical Design Group, Imperial College, London SW7, England.

Brouns, Derk, et al.; "NXE Pellicle: offering a EUV pellicle solution to the industry", Extreme Ultraviolet (EUV) Lithography VII, edited by Eric M. Panning, Kenneth A. Goldberg. Proc. of SPIE vol. 9776, 2016.

H.H. Solak, "Sub-50mm period patterns with EUV interference lithography", Microselectronic Enginnering 67-68, (2003).

* cited by examiner

TEMPERATURE CONTROLLED HEAT TRANSFER FRAME FOR PELLICLE

RELATED APPLICATION

This application claims priority on U.S. Application Ser. No. 62/476,476, filed on Mar. 24, 2017, and entitled "TEMPERATURE CONTROLLED HEAT TRANSFER FRAME FOR PELLICLE". As far as permitted, the contents of U.S. Application Ser. No. 62/476,476 are incorporated in their entirety herein by reference.

BACKGROUND

Extreme Ultraviolet Lithography (EUVL) is being developed for high volume manufacturing of semiconductor wafers. Unfortunately, existing EUVL systems are not entirely satisfactory.

SUMMARY

The present embodiments are directed toward an exposure apparatus for transferring a pattern from a reticle to a workpiece, a pellicle being positioned near the reticle. In various embodiments, the exposure apparatus includes a heat transfer frame, an illuminator, and a temperature controller. The heat transfer frame is configured to be positioned near the pellicle, the heat transfer frame defining a beam aperture. The illuminator directs a beam through the beam aperture and the pellicle at the reticle. The temperature controller controls the temperature of the heat transfer frame to control the temperature of the pellicle. In some embodiments, the illuminator directs the beam from a beam source. The beam source can be an EUV beam source. Additionally, in certain embodiments, the temperature controller cryogenically cools the heat transfer frame.

With this design, in certain embodiments, the problem of removing heat from a pellicle in an Extreme Ultra Violet Lithography (EUVL) system is solved by adding a cooled heat transfer frame so that the heat build-up in the pellicle is removed by thermal radiation. In certain embodiments, the heat transfer frame is cryogenically cooled. Alternatively, the heat transfer frame can be cooled in a different manner, i.e. other than cryogenically.

In other applications, embodiments are directed toward an exposure apparatus for transferring a pattern from a reticle to a workpiece, a pellicle being positioned near the reticle, the exposure apparatus including a heat transfer frame that is configured to be positioned near the pellicle and spaced apart a gap from the pellicle; an illuminator that directs a beam through the pellicle at the reticle; and a temperature controller that releases a transfer fluid into the gap between the heat transfer frame and pellicle to form a conductive heat path between the heat transfer frame and the pellicle.

In still other applications, embodiments are directed toward a method for transferring a pattern from a reticle to a workpiece, including the steps of positioning a pellicle near the reticle; positioning a heat transfer frame near the pellicle, the heat transfer frame defining a beam aperture; directing a beam through the beam aperture and the pellicle at the reticle with an illuminator; and controlling a temperature of the heat transfer frame with a temperature controller so as to control a temperature of the pellicle.

In yet other applications, embodiments are directed toward a method for transferring a pattern from a reticle to a workpiece, including the steps of positioning a pellicle near the reticle; positioning a heat transfer frame near the pellicle and spaced apart a gap from the pellicle; directing a beam through the pellicle at the reticle with an illuminator; and releasing a transfer fluid into the gap between the heat transfer frame and pellicle with a temperature controller to form a conductive heat path between the heat transfer frame and the pellicle.

The present embodiments are also directed toward a method for controlling the temperature of a pellicle, and a method for making a semiconductor wafer.

BRIEF DESCRIPTION OF THE DRAWINGS

The novel features of these embodiments, as well as the invention itself, both as to its structure and its operation, will be best understood from the accompanying drawings, taken in conjunction with the accompanying description, in which similar reference characters refer to similar parts, and in which.

DESCRIPTION

Embodiments of the present invention are described herein in the context of a temperature-controlled heat transfer frame for transferring heat from a pellicle that is positioned near a reticle. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application-related and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
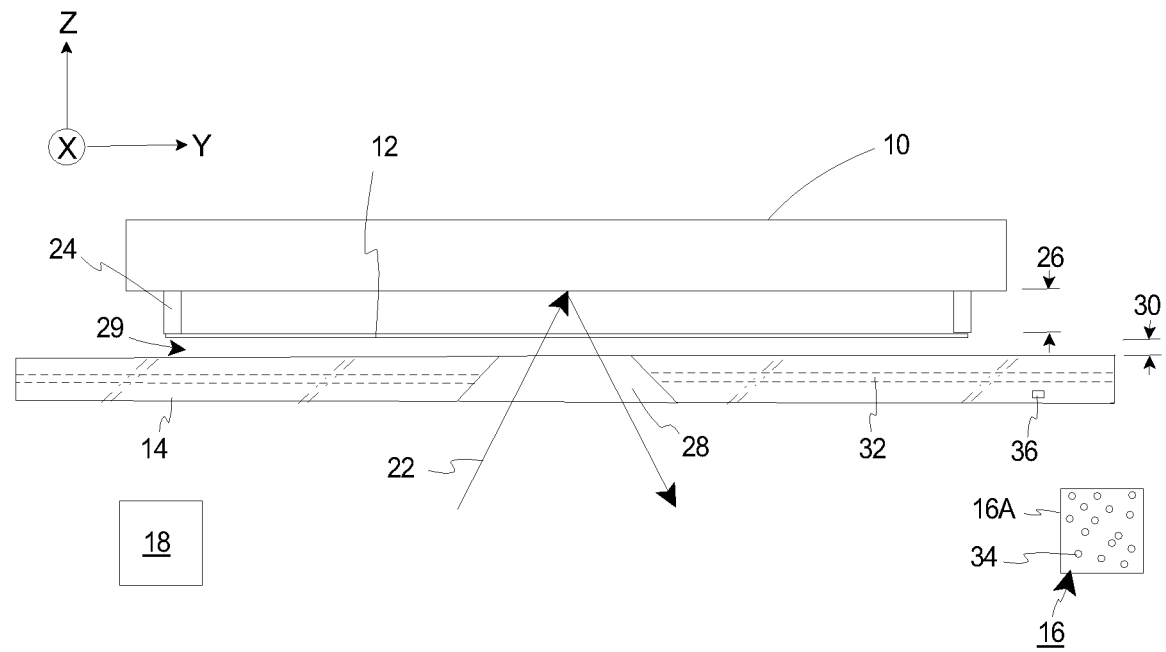
FIG. 1 is a simplified cut-away view of a reticle, a pellicle, and a heat transfer frame, a temperature controller and a control system having features of the present embodiments.

FIG. 1 is a simplified cut-away view of a reticle 10, a pellicle 12, and a heat transfer frame 14, a temperature controller 16 and a control system 18 having features of the present embodiments. FIG. 1 also illustrates a beam 22 passing through the heat transfer frame 14 and the pellicle 12 that is directed at the reticle 10, and being reflected off of the reticle 10 and passing through the pellicle 12 and the heat transfer frame 14.

As an overview, in certain embodiments, the components of FIG. 1 can be used as part of a lithography system, for transferring one or more patterns from the reticle 10 to a workpiece. With this design, the heat transfer frame 14 can be used to control the temperature of the pellicle 12. For example, the lithography system can be an Extreme Ultra Violet Lithography (EUVL) system. With this design, the problem of removing heat from a pellicle 12 in an Extreme Ultra Violet Lithography (EUVL) system is solved by adding a temperature-controlled heat transfer frame 14 so that the heat build-up in the pellicle 12 is removed by thermal radiation (radiative cooling).

The reticle 10 includes one or more patterns that are to be transferred to the workpiece (e.g. a semiconductor wafer). As a non-exclusive example, the patterns can include a plurality of densely packed lines. In certain embodiments, the reticle 10 (and the pellicle 12) are moved back and forth during the transfer of the patterns from the reticle 10 to the workpiece. In certain, non-exclusive embodiments, the reticle 10 is generally rectangular-shaped. The reticle 10 can also be referred to as a mask. In the embodiment illustrated in FIG. 1, the one or more patterns are formed in the bottom of the reticle 10.

The pellicle 12 inhibits dust and debris from reaching the patterns on the reticle 10. This will improve the accuracy of the patterns transferred to the workpiece and reduce the number of defects in the workpiece. In one, non-exclusive embodiment, the pellicle 12 is a relatively thin, rectangular, planar-shaped material that is positioned near the reticle 10. As non-exclusive examples, the pellicle 12 can have a thickness of less than approximately 0.07, 0.08, 0.09, 0.1, 0.11, 0.12, 0.13, or 0.15 microns.

Further, the pellicle 12 can be made of a material that is substantially transparent to the wavelength of the beam 22 because the beam 22 passes through the material of the pellicle 12. Unfortunately, materials used for these pellicles 12 are not perfectly transparent, they absorb EUV energy (e.g. from an EUV beam 22) and become heated. In order to reduce the amount of photons absorbed, the pellicles must be made extremely thin—generally less than 1 um thick. While this does reduce the energy absorbed, it also reduces the cross section through which the heat must conduct in order to escape. As a result, in certain designs, without the use of the heat transfer frame 14 provided herein, the temperature in the pellicle 12 can increase until equilibrium is restored and that temperature can be in excess of one hundred degrees Celsius (100° C.). As illustrated in FIG. 1, the beam 22 passes through the pellicle 12 twice and in doing so heats the pellicle 12. Because of the thin nature of the pellicle 12, the heat conduction path is poor and, as a result, the temperature in the pellicle 12 can increase to over one hundred degrees Celsius (100° C.) without cooling.

In the embodiment illustrated in FIG. 1, the pellicle 12 is secured to reticle 10 with a pellicle holder 24 (e.g. a rectangular frame) that fixedly secures the pellicle 12 to the reticle 10 so that the reticle 12 and the pellicle 12 move concurrently. For example, the pellicle holder 24 can maintain the pellicle 12 spaced apart from the reticle 10 at a fixed, reticle/pellicle separation distance 26. In alternative, non-exclusive examples, the reticle/pellicle separation distance 26 can be less than approximately five, six, seven, nine or ten millimeters.

The heat transfer frame 14 is used to transfer heat from the pellicle 12 and maintain the temperature of the pellicle 12. For example, in certain embodiments, the heat transfer frame 14 can enhance radiational cooling of the pellicle 12. The design and shape of the heat transfer frame 14 can vary. For example, the heat transfer frame 14 can be generally rectangular plate-shaped and can include a beam aperture 28 that allows the beam 22 to pass through the heat transfer frame 14 without passing through the material of the heat transfer frame 14. This allows the heat transfer frame 14 to be made of a material that is not transparent to the beam 22 and the heat transfer frame 14 will not be directly heated by the beam 22. The size of the beam aperture 28 can be varied according to the design of the lithography system with which the heat transfer frame 14 is being used. In certain embodiments, the beam aperture 28 is large enough so that the incident and reflected beam 22 do not impinge upon the heat transfer frame 14, but also small enough so the heat transfer frame 14 provides good cooling of the pellicle 12. In one non-exclusive embodiment, the beam aperture 28 is a tapered, rectangular-shaped opening (narrower at the top) in the heat transfer frame 14. As a non-exclusive example, the beam aperture 28 can have a rectangular shape that is approximately sixteen (16) millimeters by one hundred thirty (130) millimeters. Alternatively, in other non-exclusive embodiments, the beam aperture 28 can be arc-shaped or polygonal-shaped.

Still alternatively, the heat transfer frame 14 can include one or more slit blades (not shown) that are positioned near the pellicle 12.

In certain, non-exclusive embodiments, the heat transfer frame 14 is fixedly secured so that the reticle 10 and the pellicle 12 are moved relative to the stationary heat transfer frame 14. Further, the heat transfer frame 14 is maintained a gap 29 that is a frame/pellicle separation distance 30 from the pellicle 12. In alternative, non-exclusive examples, the frame/pellicle separation distance 30 can be less than approximately one, two, three, four or five millimeters.

In certain embodiments, the frame/pellicle separation distance 30 is less than the reticle/pellicle separation distance 26. In alternative, non-exclusive embodiments, the frame/pellicle separation distance 30 is approximately ten percent (10%), twenty percent (20%), thirty percent (30%), forty percent (40%) or fifty percent (50%) less than the reticle/pellicle separation distance 26.

In one, non-exclusive embodiment, the heat transfer frame 14 includes one or more circulation passageways 32 (illustrated in phantom) that allow for cooling and/or heating of the heat transfer frame 14 to control the temperature of the heat transfer frame 14 and the pellicle 12.

The temperature controller 16 controls the temperature of the heat transfer frame 14 to control the temperature of the pellicle 12. For example, the temperature controller 16 can circulate a circulation fluid 34 (illustrated as small circles) through the one or more circulation passageways 32 of the heat transfer frame 14. The temperature controller 16 can include a circulation system 16A having one or more fluid pumps, reservoirs, chillers, and/or heaters that are in fluid communication with the circulation passageways 32 for circulating the circulation fluid 34. In one embodiment, the temperature controller 16 can circulate the circulation fluid 34 through the heat transfer frame 14 in a closed loop fashion. Additionally, or alternatively, the temperature controller 16 can cryogenically cool the heat transfer frame 14. Still alternatively, the temperature controller 16 can cool the heat transfer frame 14 other than cryogenically.

Additionally, the temperature controller 16 can include one or more temperature sensors 36 (only one is illustrated) positioned on or in the heat transfer frame 14 or the pellicle 12 for feedback regarding the temperature for closed loop, temperature control of the heat transfer frame 14 and/or the pellicle 12.

The control system 18 can control the various components of the system. For example, the control system 18 can include one or more processors and storage devices.

With the present design, the heat transfer frame 14 is fixed relative to the exposure beam 22 and can cool different portions of the pellicle 12 as the reticle 10 and pellicle 12 are moved back and forth during exposure. The heat transfer frame 14 is cooled to remove the heat from the pellicle 12 by radiation. In certain embodiments, because of the large amount of heat that must be removed, and because of the poor emissivity of the pellicle 12, the heat transfer frame 14 must be very cold. As non-exclusive examples, the temperature controller 16 can control the heat transfer frame 14 to be at least fifty (50), one hundred (100), one hundred fifty (150), two hundred (200), or two hundred fifty (250) degrees Celsius lower than a desired temperature of the pellicle 12. Stated in another fashion, in alternative, non-exclusive embodiments, the temperature controller 16 can control the temperature of the heat transfer frame 14 to be at most 0, −50, −100, −150, or −196 degrees Celsius.

As EUV technology continues to develop, the illumination power absorbed by the pellicle 12 will likely increase and so cryogenic temperatures of the heat transfer frame 14 may be necessary in order to remove all the heat.

With the present design, the heat transfer frame 14 can remove heat from the pellicle 12 without contact and can be easily be scaled for future illumination powers. It also removes heat uniformly from the pellicle surface and is not constrained by the extremely small cross-section of the pellicle 12 itself.

Figure 2:
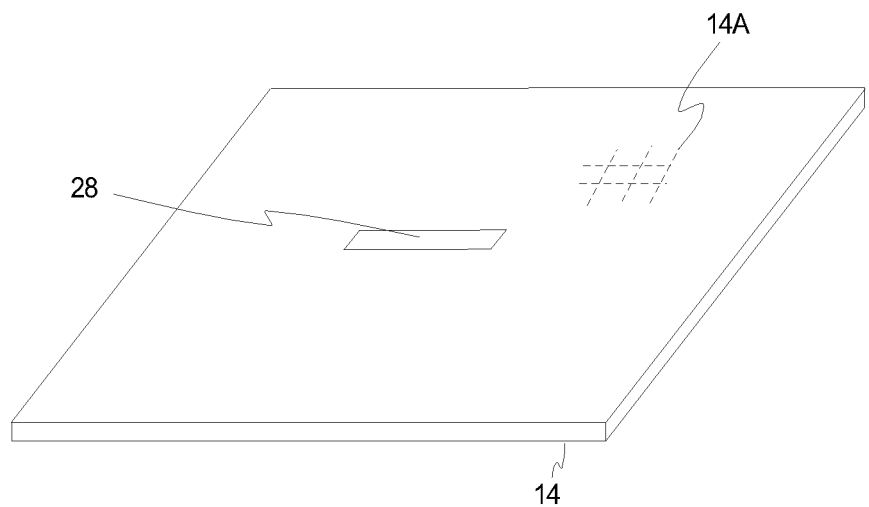
FIG. 2 is a simplified, top perspective view of the heat transfer frame illustrated in FIG. 1.

FIG. 2 is a simplified, top perspective view of the heat transfer frame 14 illustrated in FIG. 1 including the beam aperture 28. It should be noted that the heat transfer frame 14 can include a high emissivity coating 14A (illustrated with a dashed lines) to increase the heat transfer from the pellicle 12 to the heat transfer frame 14. As a non-exclusive example, the high emissivity coating 14A can have an emissivity of at least approximately 0.9.

Figure 3A:
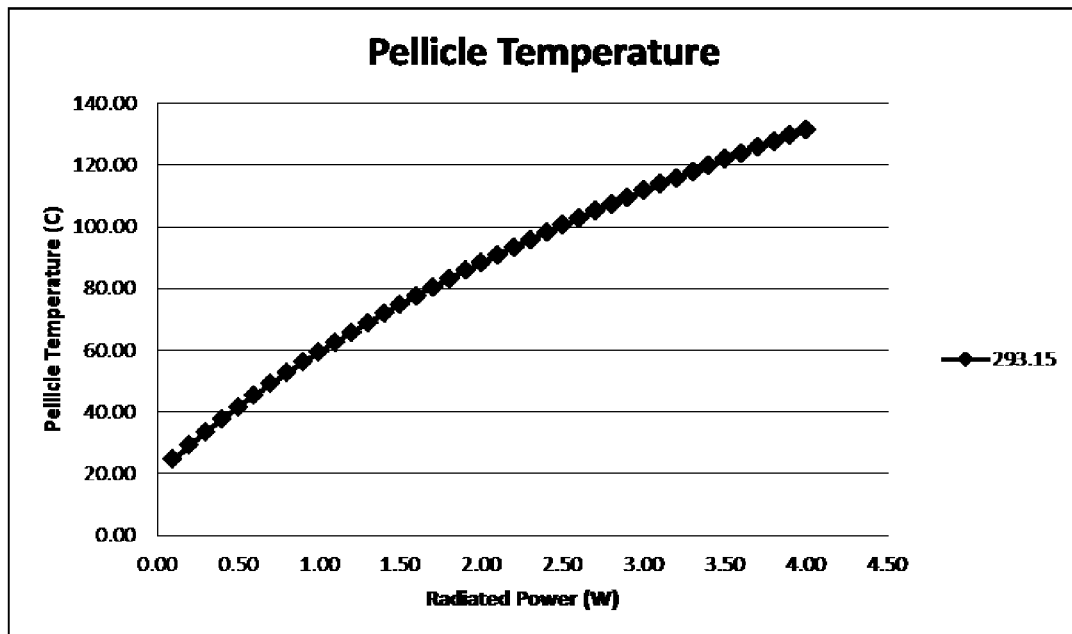
FIGS. 3A and 3B alternatively illustrate pellicle temperature versus radiated power.

FIG. 3A is a graph that illustrates pellicle temperature versus radiated power for a case with no direct cooling of the pellicle. In this case, it is assumed that the power coming from the source is 100 W and there are four reflections before the reticle. In this particular example, the absorbed power of the pellicle is −2.83 W (using an absorbance value of 0.1), although it is appreciated that in order for equilibrium to be achieved, the radiated power should equal the absorbed power. In this case, the heat in the pellicle radiates to the surroundings of the system assumed to be at 20° C. Additionally, the emittance of the pellicle is assumed to be 0.2.

Figure 3B:
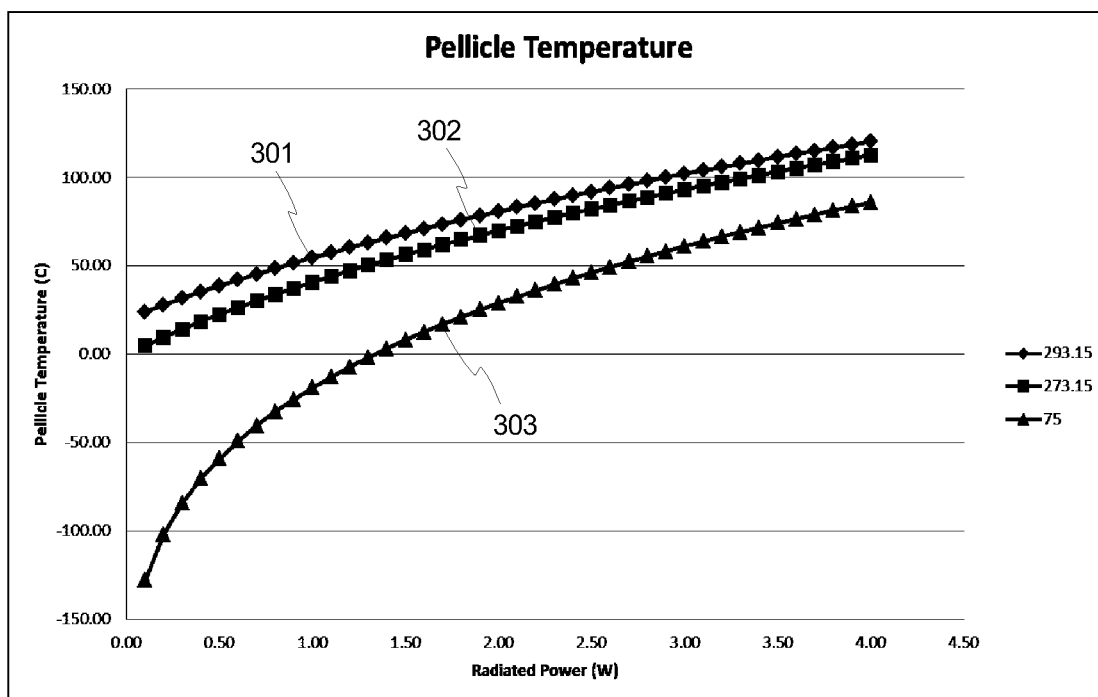

FIG. 3B is a graph that illustrates pellicle temperature versus radiated power for a case for cooling of the pellicle with the heat transfer frame. In FIG. 3B, (i) for line 301, the heat transfer frame was maintained at 20° C.; (ii) for line 302 the heat transfer frame was maintained at 0° C.; and (iii) for line 303, the heat transfer frame was maintained at 77K (liquid nitrogen temperature). With reference to FIG. 3B, the heat transfer frame acting as a heat sink significantly reduces the pellicle temperature. Further, cooling of the heat transfer frame to cryogenic temperatures can reduce the pellicle temperature from >100° C. to 50° C.

Figure 4:
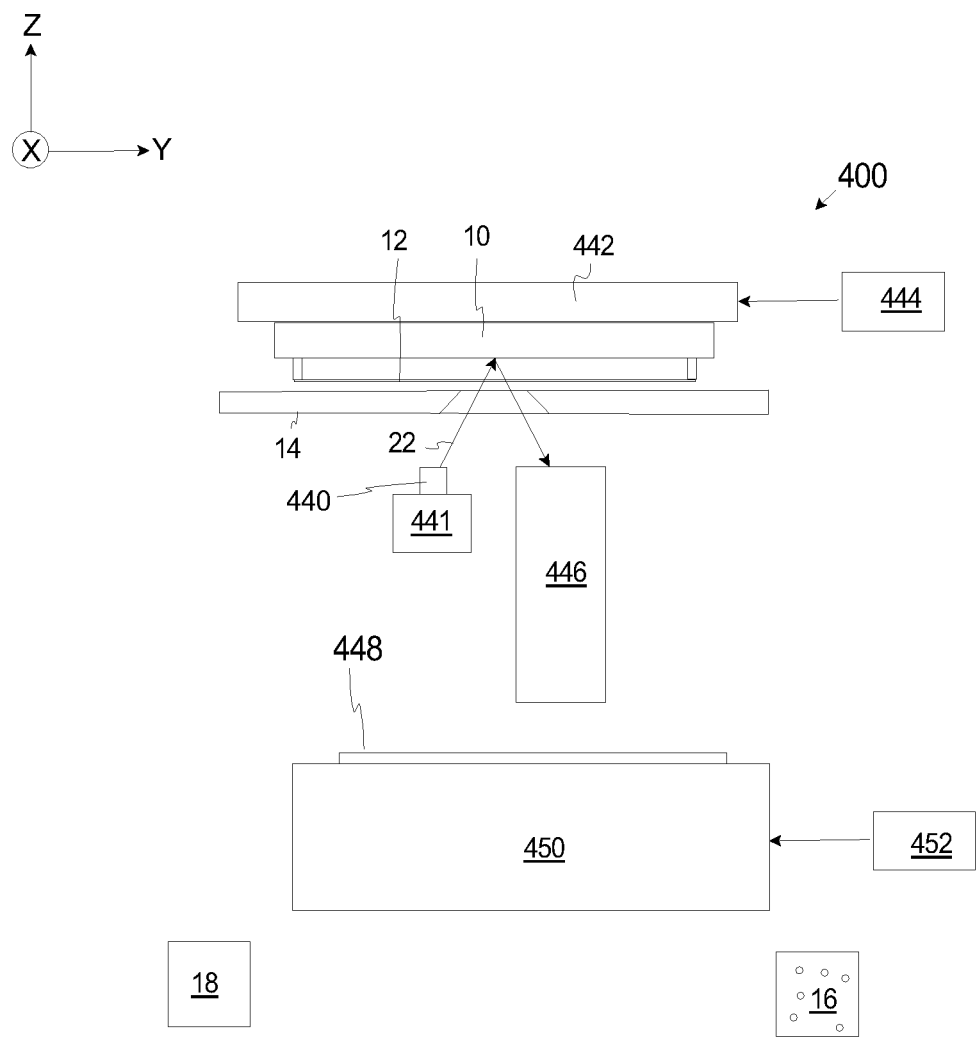
FIG. 4 is a schematic illustration of an exposure apparatus having features of the present embodiments.

FIG. 4 is a simplified, schematic view illustrating an exposure apparatus 400 (e.g. an EUVL) useful with the present embodiments. The exposure apparatus 400 can include (i) an illuminator 440 that directs the beam 22 (e.g. that is generated by a beam source 441 such as an EUV beam source) at the reticle 10; (ii) a reticle stage 442 that retains the reticle 10 and the pellicle 12; (iii) a reticle mover 444 that moves the reticle stage 442, the reticle 10 and the pellicle 12 relative to the beam 22; (iv) an optical assembly 446 that focuses the beam 22 reflected off of the reticle 10 onto a workpiece 448 (e.g. a semiconductor wafer); (v) a workpiece stage 450 that retains the workpiece 448; (vi) a workpiece mover 452 that moves the workpiece stage 450 and the workpiece 448 relative to the beam; (vii) the heat transfer frame 14; (viii) the temperature controller 16; and (ix) the control system 18. In certain embodiments, many of the components are positioned in a vacuum or other controlled environment.

The exposure apparatus 400 is particularly useful as a lithographic device that transfers a pattern (not shown) of an integrated circuit from the reticle 10 onto the semiconductor wafer 448.

Depending upon the design of the exposure apparatus 400, the optical assembly 446 can magnify or reduce the image illuminated on the reticle.

Figure 5:
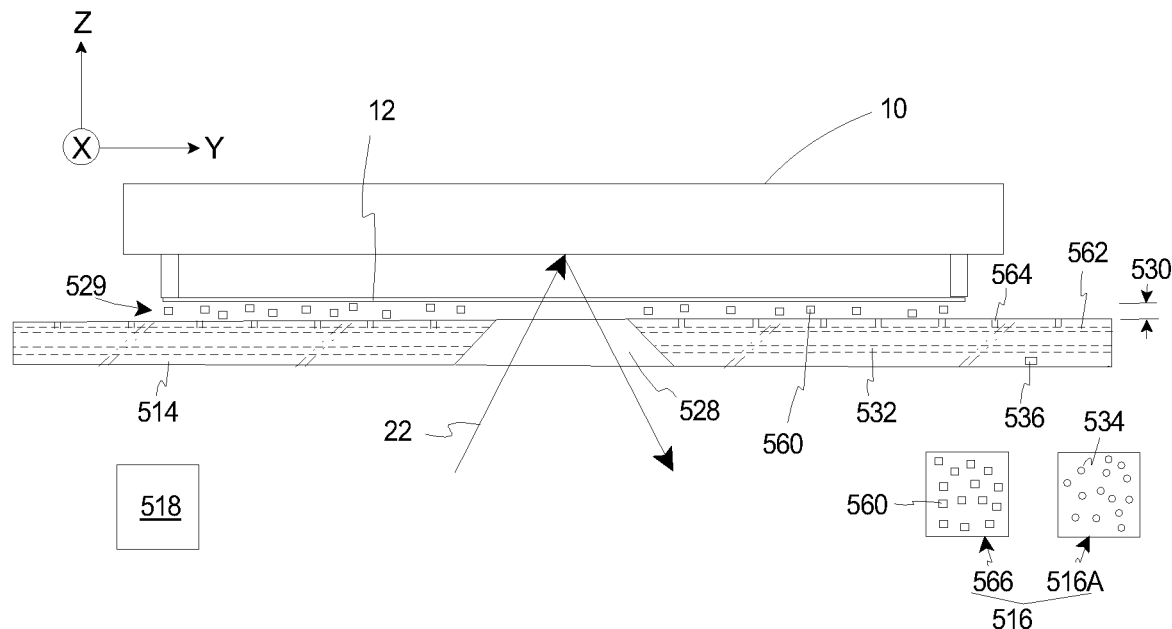
FIG. 5 is a simplified cut-away view of the reticle and the pellicle, and another embodiment of the heat transfer frame, the temperature controller, and the control system.

FIG. 5 is a simplified cut-away view of the reticle 10 and the pellicle 12, and another embodiment of the heat transfer frame 514, the temperature controller 516, and the control system 518. FIG. 5 also illustrates the beam 22 passing through the heat transfer frame 514 and the pellicle 12 that is directed at the reticle 10, and being reflected off of the reticle 10 and passing through the pellicle 12 and heat transfer frame 514. In FIG. 5, the reticle 10 and the pellicle 12 can be similar to the corresponding components described above and illustrated in FIG. 1.

As an overview, in certain embodiments, the components of FIG. 5 can be used as part of a lithography system (e.g. the exposure apparatus 400 of FIG. 4), for transferring one or more patterns from the reticle 10 to a workpiece 448 (illustrated in FIG. 4). With this design, the heat transfer frame 514 can be used to control the temperature of the pellicle 12. In the embodiment illustrated in FIG. 5, conductive heat transfer can be used to control the temperature of the pellicle 12. For example, the lithography system can be an EUVL system. With this design, the problem of removing heat from a pellicle 12 in a vacuum environment is solved by adding a heat transfer frame 514 and releasing a transfer fluid 560 (illustrated as small squares) into a gap 529 between the pellicle 12 and the transfer frame 514 so that the heat build-up in the pellicle 12 is removed by conductive heat transfer.

The heat transfer frame 514 is used to transfer heat from the pellicle 12 and maintain the temperature of the pellicle 12. The design and shape of the heat transfer frame 514 can vary. For example, the heat transfer frame 514 can be generally rectangular plate-shaped and can include a beam aperture 528 somewhat similar to the design illustrated in FIG. 1 and described above.

In certain, non-exclusive embodiments, the reticle 10 and the pellicle 12 are moved relative to the stationary heat transfer frame 514. Further, the heat transfer frame 14 is maintained the gap 529 (e.g. a frame/pellicle separation distance 530) from the pellicle 12. In alternative, non-exclusive examples, the frame/pellicle separation distance 530 can be less than approximately 100, 200, 300, 400 or 500 microns. Additionally or in the alternative, the size of the gap 529, e.g. the frame/pellicle separation distance 530, can be different on opposite sides of the pellicle 12. In certain embodiments, the transfer fluid 560 may be more likely to flow to one side versus the other, e.g., to the left and not to the right. Thus, to reduce undesired flow into the exposure gap, in one non-exclusive embodiment, the gap 529 at the right can be ~100 microns, while the gap 529 at the left could be 500 microns.

In one, non-exclusive embodiment, the heat transfer frame 514 includes one or more transfer passageways 562 that allow for the release of the transfer fluid 560 into the gap 529 to create the conductive heat path between the heat transfer frame 514 and the pellicle 12. With this design, the transfer fluid 560 allows for the heat transfer frame 14 to remove heat from and/or control the temperature of the pellicle 12.

In one embodiment, one or more transfer passageways 562 can include one or more outlets 564 that can face the pellicle 12 and that can release the transfer fluid 560 into the gap 529 between the heat transfer frame 514 and the pellicle 12. As a non-exclusive example, the transfer fluid 560 can be an inert gas, such as helium.

Additionally, in one embodiment, the heat transfer frame 514 may have at least one inlet (not shown) which collects (or absorbs, or sucks, or attracts) the transfer fluid 560 and which is defined around the beam aperture 528. For example, the inlet may be defined at a rim (or the periphery) of the beam aperture 528.

With this design, the temperature controller 516 can be used to control the temperature of the pellicle 12 and the temperature of the heat transfer frame 514. For example, the temperature controller 516 can direct the transfer fluid 560 through the one or more transfer passageways 562 and out the outlets 564 to control the temperature of the pellicle 12 and/or the heat transfer frame 514. In this embodiment, the temperature controller 516 can include a transfer system 566 having one or more fluid pumps, reservoirs, chillers, and/or heaters that are in fluid communication with the transfer passageway(s) for directing the transfer fluid 560 into the transfer passageways 562 and into the gap 529 and control the flow rate into the gap 529.

Additionally and optionally, the temperature controller 516 can circulate a circulation fluid 534 (illustrated as small circles) through the one or more circulation passageways 532 of the heat transfer frame 514. In this embodiment, the temperature controller 516 can include a circulation system 516A having one or more fluid pumps, reservoirs, chillers, and/or heaters that are in fluid communication with the circulation passageway(s) 532 for circulating the circulation fluid 534. In one embodiment, the temperature controller 516 can circulate the circulation fluid 534 through the heat transfer frame 514 in a closed loop fashion.

Moreover, the temperature controller 516 can include one or more temperature sensors 536 (only one is illustrated) positioned on or in the heat transfer frame 514 or the pellicle 12 for feedback regarding the temperature for closed loop, temperature control of the heat transfer frame 514 and/or the pellicle 12.

The control system 518 can control the various components of the system. For example, the control system 518 can include one or more processors and storage devices.

With the present design, the heat transfer frame 514 is fixed relative to the exposure beam 22 and can cool different portions of the pellicle 12 as the reticle 10 and pellicle 12 are moved back and forth during exposure.

Figure 6:
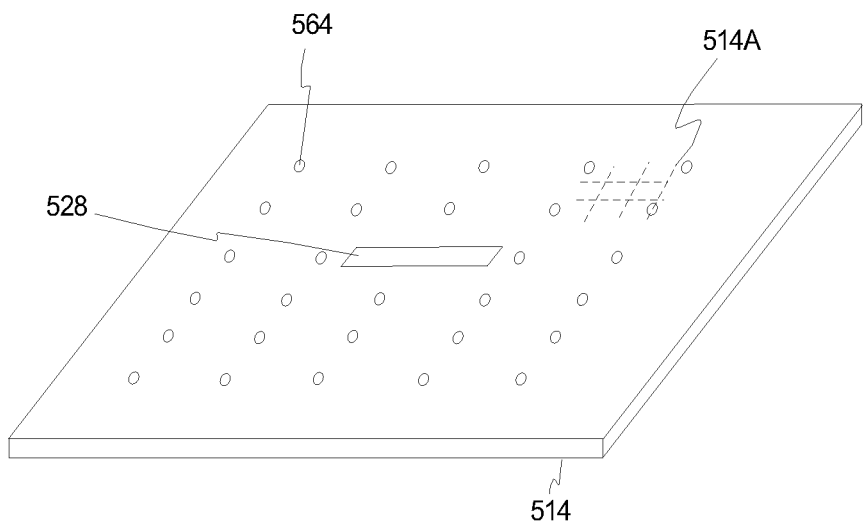
FIG. 6 is a simplified, top perspective view of the heat transfer frame illustrated in FIG. 5.

FIG. 6 is a simplified, top perspective view of the heat transfer frame 514 illustrated in FIG. 5 including the beam aperture 528 and the plurality of spaced apart outlets 564 in the side of the transfer frame 514 that faces the pellicle 12 (illustrated in FIG. 5). It should be noted that the heat transfer frame 514 can include a high emissivity coating 514A (illustrated with a dashed lines) to increase the heat transfer from the pellicle 12 to the heat transfer frame 514.

Figure 7:
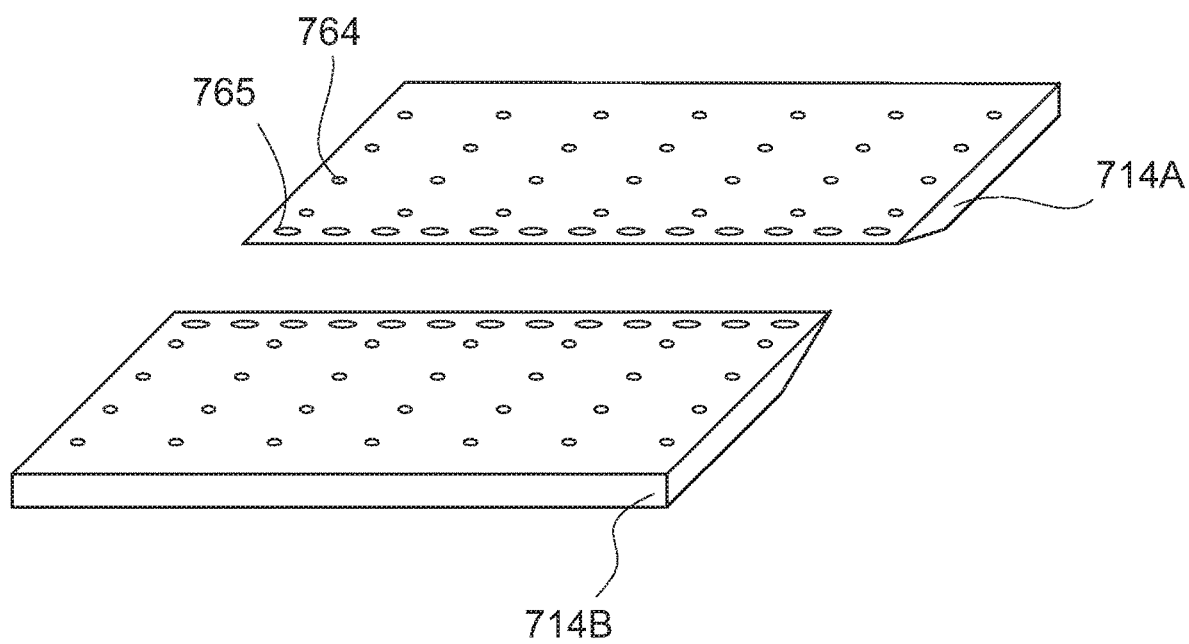
FIG. 7 is a simplified, top perspective view of another embodiment of the heat transfer frame.

In another embodiment, the heat transfer frame may be divided into multiple, i.e. at least two, frame members, such as shown in FIG. 7. More specifically, FIG. 7 is a simplified, top perspective view of the heat transfer frames 714A, 714B that are used in lieu of a single heat transfer frame as in the previous embodiments. These heat transfer frames 714A, 714B define a beam aperture 728 therebetween. The heat transfer frames 714A, 714B have outlets 764 in the side of the transfer frames 714A, 714B that faces the pellicle (not shown). Additionally, the heat transfer frames 714A, 714B also include inlets 765 which are connected to a vacuum source, for example, a vacuum pump. The inlets 765 may increase the degree of vacuum of the atmosphere around the exposure beam path.

In some alternative embodiments, the outlets need not be provided within the heat transfer frame. For example, in such embodiments, the outlets may be provided between the heat transfer frame and the pellicle at the side of a space between the heat transfer frame and the pellicle.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

It is understood that although a number of different embodiments of the heat transfer frame 14 and the temperature controller 16 have been illustrated and described herein, one or more features of any one embodiment can be combined with one or more features of one or more of the other embodiments, provided that such combination satisfies the intent of the present invention.

While a number of exemplary aspects and embodiments of a heat transfer frame 14 and a temperature controller 16 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. An exposure apparatus for transferring a pattern from a reticle to a workpiece, a pellicle being positioned adjacent to, but spaced apart from the reticle, the exposure apparatus comprising:
   a heat transfer frame that is configured to be positioned adjacent to, but spaced apart from the pellicle, the heat transfer frame defining a beam aperture;

an illuminator that directs an EUV radiation beam through the beam aperture and the pellicle at the reticle; and a temperature controller that controls a temperature of the heat transfer frame, the heat transfer frame being used to control a temperature of the pellicle.

2. The exposure apparatus of claim 1 wherein the heat transfer frame is spaced apart a frame/pellicle separation distance from the pellicle and wherein the frame/pellicle separation distance is less than five millimeters.

3. The exposure apparatus of claim 1 wherein the pellicle is spaced apart from the reticle a reticle/pellicle separation distance; wherein the heat transfer frame is spaced apart a frame/pellicle separation distance from the pellicle; and wherein the frame/pellicle separation distance is less than the reticle/pellicle separation distance.

4. The exposure apparatus of claim 1 wherein the illuminator directs the beam from a beam source.

5. The exposure apparatus of claim 4 wherein the beam source is an EUV beam source.

6. The exposure apparatus of claim 1 wherein the temperature controller cryogenically cools the heat transfer frame.

7. The exposure apparatus of claim 1 further comprising the reticle, and the pellicle that is positioned adjacent to, but spaced apart from the reticle.

8. The exposure apparatus of claim 1 wherein at least part of the illuminator is positioned between the heat transfer frame and the workpiece.

9. The exposure apparatus of claim 8 further comprising an optical assembly arranged between the heat transfer frame and the workpiece.

10. An exposure apparatus for transferring a pattern from a reticle to a workpiece, a pellicle being positioned adjacent to, but spaced apart from the reticle, the exposure apparatus comprising:

a heat transfer frame that is configured to be positioned adjacent to the pellicle and spaced apart a gap from the pellicle, the heat transfer frame having a transfer passageway formed therein;

an illuminator that directs a beam through the pellicle at the reticle; and a temperature controller that directs a transfer fluid into and through the transfer passageway formed within the heat transfer frame to control a temperature of the heat transfer frame, the transfer fluid then being released into the gap between the heat transfer frame and pellicle to form a conductive heat path between the heat transfer frame and the pellicle so that heat is transferred from the pellicle to the heat transfer frame.

11. The exposure apparatus of claim 10 wherein the heat transfer frame is spaced apart a frame/pellicle separation distance from the pellicle and wherein the frame/pellicle separation distance is less than five millimeters.

12. The exposure apparatus of claim 10 wherein the pellicle is spaced apart from the reticle a reticle/pellicle separation distance; wherein the heat transfer frame is spaced apart a frame/pellicle separation distance from the pellicle; and wherein the frame/pellicle separation distance is less than the reticle/pellicle separation distance.

13. The exposure apparatus of claim 10 wherein the illuminator directs the beam from a beam source.

14. The exposure apparatus of claim 13 wherein the beam source is an EUV beam source.

15. The exposure apparatus of claim 10 wherein the temperature controller includes a circulation system for circulating a circulation fluid through the heat transfer frame.

16. The exposure apparatus of claim 10 further comprising the reticle, and the pellicle that is positioned adjacent to, but spaced apart from the reticle.

17. The exposure apparatus of claim 10 wherein the temperature controller further directly controls a temperature of the heat transfer frame.

18. The exposure apparatus of claim 10 wherein at least part of the illuminator is positioned between the heat transfer frame and the workpiece.

19. The exposure apparatus of claim 18 further comprising an optical assembly arranged between the heat transfer frame and the workpiece.

20. A method for transferring a pattern from a reticle to a workpiece, the method comprising:

positioning a pellicle adjacent to, but spaced apart from the reticle;

positioning a heat transfer frame adjacent to, but spaced apart from the pellicle, the heat transfer frame defining a beam aperture;

directing an EUV radiation beam through the beam aperture and the pellicle at the reticle with an illuminator; and controlling a temperature of the heat transfer frame with a temperature controller, the heat transfer frame being used to control a temperature of the pellicle.

21. The method of claim 20 wherein the step of positioning the heat transfer frame includes positioning the heat transfer frame so that the heat transfer frame is spaced apart a frame/pellicle separation distance from the pellicle of less than five millimeters.

22. The method of claim 20 wherein the step of directing includes directing the beam from a beam source through the beam aperture and the pellicle at the reticle with the illuminator.

23. The method of claim 22 wherein the step of directing the beam from the beam source includes the beam source being an EUV beam source.

24. The method of claim 20 wherein the step of controlling includes cryogenically cooling the heat transfer frame with the temperature cooler.

25. The exposure method of claim 20 wherein at least part of the illuminator is positioned between the heat transfer frame and the workpiece.

26. The exposure method of claim 25 further comprising projecting the pattern onto the workpiece with an optical assembly arranged between the heat transfer frame and the workpiece.

27. An exposure apparatus for transferring a pattern from a reticle to a workpiece, a pellicle being positioned adjacent to, but spaced apart from the reticle, the exposure apparatus comprising:

a heat transfer frame that is configured to be positioned adjacent to the pellicle and spaced apart a gap from the pellicle, the heat transfer frame having a transfer passageway formed therein;

an illuminator that directs a beam through the pellicle at the reticle, wherein the illuminator directs an EUV radiation beam toward the pellicle; and a temperature controller that directs a transfer fluid into and through the transfer passageway formed within the heat transfer frame, the transfer fluid then being released into the gap between the heat transfer frame and pellicle to form a conductive heat path between the heat transfer frame and the pellicle.

28. An exposure apparatus for exposing a pattern on a workpiece, the exposure apparatus comprising:

an illuminator configured to illuminate a reticle via a pellicle with EUV radiation, at least part of the illuminator being positioned between the reticle and the workpiece;

an optical assembly configured to form a pattern image of the reticle with the EUV radiation from the reticle via the pellicle, at least part of the optical assembly being positioned between the reticle and the workpiece;

a heat transfer frame positioned spaced apart a gap from the pellicle, between the at least part of the illuminator and the reticle, and between the at least part of the optical assembly and the reticle, the EUV radiation from the illuminator passing through a beam aperture formed on the heat transfer frame, and the EUV radiation from the reticle to the optical assembly passing through the beam aperture; and a temperature controller configured to control a temperature of the pellicle by controlling a temperature of the heat transfer frame.

29. The exposure apparatus of claim 28 wherein the heat transfer frame includes a pellicle side surface, and wherein heat of the pellicle is transferred from a pellicle surface to the pellicle side surface of the heat transfer frame.

30. The exposure apparatus of claim 29 further comprising a reticle mover configured to move the reticle along a scan direction which is parallel to a plane in which the pellicle side surface is positioned.

31. The exposure apparatus of claim 28 wherein the heat transfer frame includes a temperature sensor positioned on or within the heat transfer frame.

32. The exposure apparatus of claim 28 wherein the at least part of the illuminator and the at least part of the optical assembly are positioned in a vacuum.

33. The exposure apparatus of claim 32 wherein a fluid is positioned between the pellicle and the heat transfer frame.

34. An exposure apparatus for exposing a pattern on a workpiece, the exposure apparatus comprising:

an illuminator configured to illuminate a reticle via a pellicle with EUV radiation, at least part of the illuminator being positioned between the reticle and the workpiece;

an optical assembly configured to form a pattern image of the reticle with the EUV radiation from the reticle via the pellicle, at least part of the optical assembly being positioned between the reticle and the workpiece;

a heat transfer frame positioned between the at least part of the illuminator and the reticle, and between the at least part of the optical assembly and the reticle, the EUV radiation from the illuminator passing through a beam aperture formed on the heat transfer frame, and the EUV radiation from the reticle to the optical assembly passing through the beam aperture, wherein the heat transfer frame includes a fluid passageway within the heat transfer frame; and a temperature controller configured to control a temperature of the pellicle by controlling a temperature of the heat transfer frame, wherein a temperature of fluid that passes through the fluid passageway is controlled by the temperature controller.

35. An exposure method for exposing a pattern on a workpiece, the exposure method comprising:

illuminating a reticle via a pellicle with EUV radiation from an illuminator, at least part of the illuminator being positioned between the reticle and the workpiece;

forming a pattern image of the reticle with the EUV radiation from the reticle via the pellicle by using an optical assembly, at least part of the optical assembly being positioned between the reticle and the workpiece;

positioning a heat transfer frame spaced apart a gap from the pellicle, between the at least part of the illuminator and the reticle, and between the at least part of the optical assembly and the reticle, the EUV radiation from the illuminator passing through a beam aperture formed on the heat transfer frame, and the EUV radiation from the reticle to the optical assembly passing through the beam aperture; and controlling a temperature of the pellicle with a temperature controller by controlling a temperature of the heat transfer frame.

\* \* \* \* \*